United States Patent [19]

Okase

[11] Patent Number: 5,749,723
[45] Date of Patent: May 12, 1998

[54] HEAT TREATMENT APPARATUS

[75] Inventor: Wataru Okase, Kanagawa-Ken, Japan

[73] Assignees: Tokyo Electron Limited, Tokyo-to; Tokyo Electron Tohoku Ltd., Iwate-ken, both of Japan

[21] Appl. No.: 489,937

[22] Filed: Jun. 13, 1995

[30] Foreign Application Priority Data

Jun. 17, 1994 [JP] Japan .................................. 6-159533

[51] Int. Cl.$^6$ .................................................. F27D 3/12
[52] U.S. Cl. ........................... 432/241; 432/152; 432/206
[58] Field of Search ............................. 432/206, 241, 432/152

[56] References Cited

U.S. PATENT DOCUMENTS 5,329,095  7/1994  Okase ....................................... 432/152

FOREIGN PATENT DOCUMENTS 59-184736  10/1984  Japan .
61-247022  12/1986  Japan .
 4-93026   3/1992  Japan .

OTHER PUBLICATIONS

Encyclopedia of Chemical Technology, 3rd Edition, vol. 20, pp. 802–806, 1982 John Wiley & Sons.

Primary Examiner—Noah P. Kamen
Attorney, Agent, or Firm—Beveridge, Degrandi, Weilacher & Young, LLP

[57] ABSTRACT

A vertical heat treatment apparatus that includes a reaction tube for wafers to be loaded into from below and a heating unit surrounding the reaction vessel, or a single wafer heat treatment apparatus having a holder which provides a mount for wafers being loaded one by one into a reaction tube for heat treatment. The reaction tube has a structure of, e.g., two layers with a first layer of synthetic quartz glass made from a silicon compound, such as silicon tetrachloride, as a raw material. The first layer represents a surface that comes in contact with a heat treatment atmosphere. The second layer is of molten quartz glass made from quartz as a raw material and is external to the first layer. Synthetic quartz glass contains such traces of metals that scattered amounts of metals released into a heat treatment atmosphere due to exposure of the reaction tube to high temperatures is substantially zero. Furthermore, synthetic quartz glass and molten quartz glass are laid on each other, which improves heat resistance of the reaction tube. Thus, in conducting oxidation, diffusion, and other heat treatments on objects to be treated, e.g., semiconductor wafers, contamination of the objects with impurities can be minimized.

24 Claims, 5 Drawing Sheets

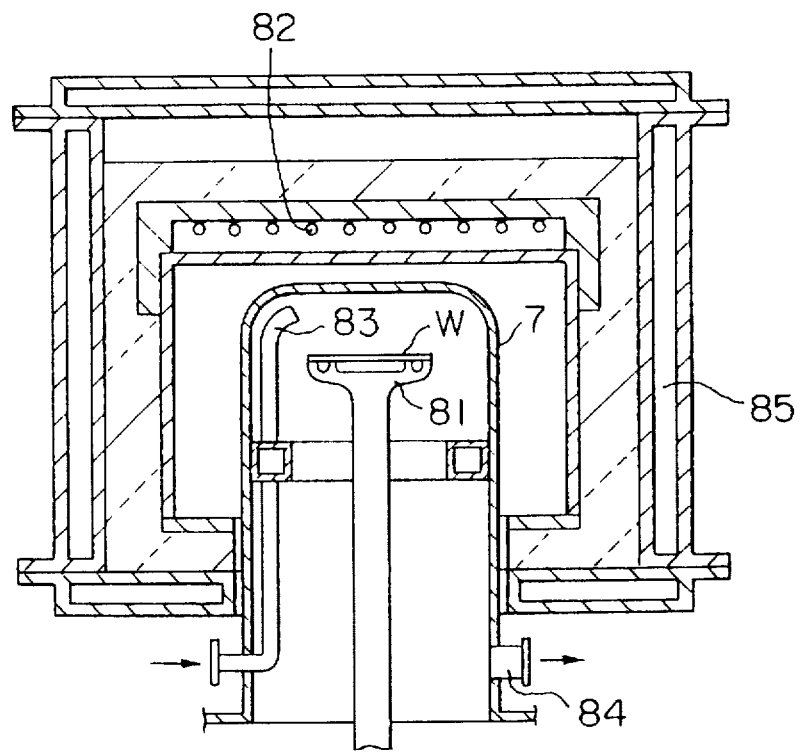
F I G. 6
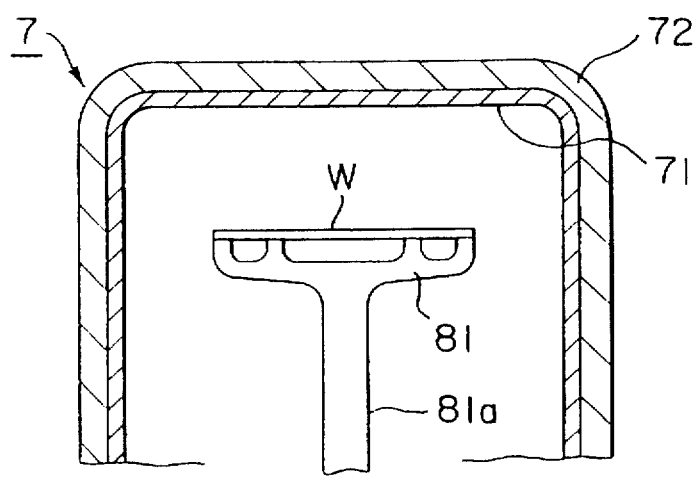
F I G. 7

HEAT TREATMENT APPARATUS

BACKGROUND OF THE INVENTION

The present invention relates to a heat treatment apparatus.

A fabrication process of a semiconductor device includes oxidation by which the surface of silicon, on which forms water, is oxidized at a high temperature to form an oxide film (insulation film), and diffusion by which a silicon layer formed on the surface of a doped layer is heated to thermally diffuse an impurity in the silicon layer.

As a heat treatment apparatus for such oxidation and diffusion, a vertical heat treatment apparatus for batch processing is known. Its structure will be briefed below. A reaction tube having the lower end opened and a heater surrounding the reaction tube constitute a vertical heat treatment furnace. A wafer boat is inserted into the furnace for treating objects supported by the wafer boat. A boat elevator is provided for moving up and down the wafer boat from a stand-by chamber below the vertical heat treatment furnace into and out of the heat treatment furnace. The wafer boat holds horizontally oriented wafers in a vertically spaced stack. The boat is loaded into a reaction tube furnace where the wafers are thermally treated.

In forming, an oxide film (e.g., an oxide film for a capacitor insulation film and a gate oxide film), or when diffusing impurity ions, the film quality, film thickness and diffusion depth are highly influenced by a thermal budget. This is especially true when very thin films and shallow junctions are necessary. In the batch heat treatment apparatus, large differences take place in the thermal budget between wafers earlier loaded and wafers later loaded. These large differences can adversely affect the treatment process.

As an improvement of the above-described vertical heat treatment apparatus there has been proposed a single wafer heat treatment apparatus in which wafers are set in position in the reaction tube one by one on respective holders, and the interior of the reaction tube is quickly heated. The interior of the reaction tube is heated up to a high temperature (e.g., as high as 1000° C. for oxidation), and the reaction tube of the above-described batch heat treatment apparatus and the single wafer heat treatment apparatus are formed of molten quartz glass (called vitrified quartz glass). The molten quartz glass or vitrified quartz glass is formed from quartz by a melting method. Molten quartz glass has a softening point near 170° C., a thermal expansion coefficient as small as an order of $10^7$ near 1000° C., and good heat resistance. Molten quartz glass is suitably used in the heat treatment apparatus.

As semiconductor device patterns have become increasingly more micronized and since semiconductor devices are being formed of thinner films, allowance ranges of contamination with heavy metals and other impurities have correspondingly become severely narrowed. In not only clean rooms where wafers are processed, but also the heat treatment region of the above-described heat treatment apparatus, scattering amounts of heavy metals, etc. must be substantially zero. The above-described molten glass forming the reaction tube, which is formed of natural quartz as the raw material contains, by a ppm order, heavy metals, such as aluminium, iron, copper, etc., alkaline metals, alkali metal, and alkaline-earth metal. When the reaction tube is heated up to above 1000° C., these heavy metals are released from the glass and scatter in the heat treatment region. Their scattering amounts are rather small, and thus these heavy metals were previously not considered seriously problematic. This is not the case, however, with the current micronized patterns of devices. As patterns of devices are increasingly micronized, traces of the scattering heavy metals increasingly affect the characteristics of the treated devices. A result of the increasing affect of the contaminates is lower throughputs. Quartz glass includes, in addition to molten glass, synthesized quartz glass formed of a silicon compound as a raw material. Synthesized quartz glass contains much less heavy metals, but has such a low softening point that repeated use deforms the reaction tube. Synthesized quartz glass is also expensive.

SUMMARY OF THE INVENTION

The present invention was made in view of such problems. An object of the present invention is to provide a heat treatment apparatus which can reduce impurity contamination on objects, such as wafers, to be treated.

The heat treatment apparatus for loading objects to be treated into a reaction vessel and heat treating the objects according to the present invention is characterized in that the reaction vessel comprises a first layer of synthetic quartz glass which is an inside surface to be contacted to a heat treatment atmosphere, and a second layer of molten quartz glass having an outer position with respect to the first layer.

If the reaction vessel is made of synthetic quartz glass alone, there is a risk that the reaction vessel may be deformed by repeated use because of its low softening point. The reaction vessel of the present invention having the first layer, the inside surface layer made of synthetic quartz glass, and the molten quartz glass laid on the outside of the first layer has higher heat resistance as a whole and is free from the risk of thermal deformation. In addition, the synthetic quartz glass which contacts heat treatment atmospheres has very small heavy metal contents of below a ppb order. Thus, even when a heat treatment temperature is high, the amount of heavy metals that scatter into the heat treatment atmosphere is substantially zero. Accordingly, the contamination of objects to be treated with heavy metals can be suppressed. The combination of the synthetic quartz glass and molten quartz glass is applied to an objects-to-be-treated holder, and an intermediate member between the cap of the vertical heat treatment apparatus and the objects-to-be-treated holder, whereby contamination of the objects-to-be-treated with the heavy metals can be suppressed.

BRIEF DESCRIPTION OF THE DRAWINGS

FIG. 6 is a vertical sectional view of a single wafer heat treatment apparatus according to the present invention showing the general structure thereof.

FIG. 7 is an enlarged partial sectional view of a reaction tube used in the sheet heat treatment apparatus of FIG. 6.

DETAILED DESCRIPTION OF THE PREFERRED EMBODIMENTS

Figure 1:
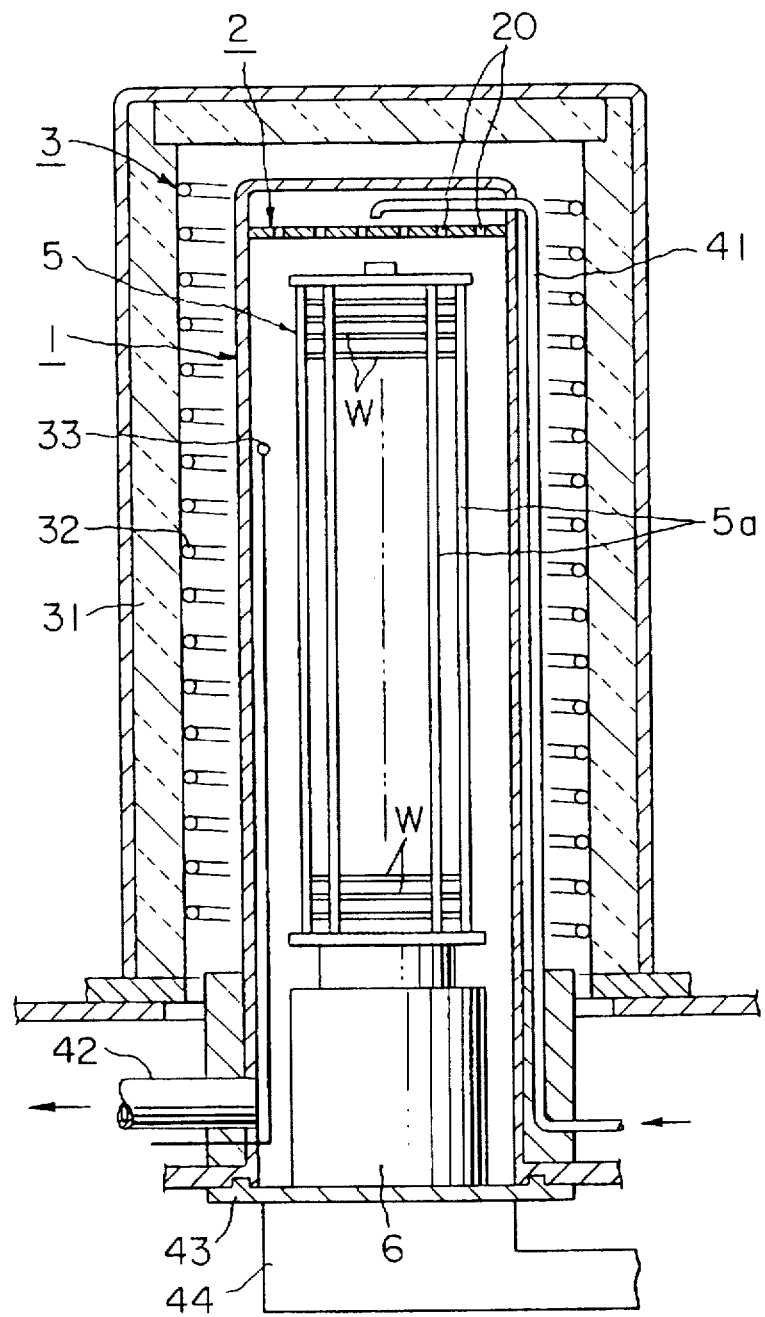
FIG. 1 is a vertical sectional view of the batch vertical heat treatment apparatus according to one embodiment of the present invention showing the general structure thereof.

An embodiment in which the present invention is applied to a vertical heat treatment apparatus for oxidation and diffusion will be explained below. FIG. 1 shows a state in which objects, wafers, to be processed are loaded in a reaction tube 1, a reaction vessel. The reaction tube 1 has a cylindrical shape having the lower end opened and the upper end closed. A gas introduction plate 2 having a number of gas introduction holes 20 is provided in one-piece with the reaction tube 1 immediately below the upper end of the reaction tube 1 by welding or other means.

Figure 2:
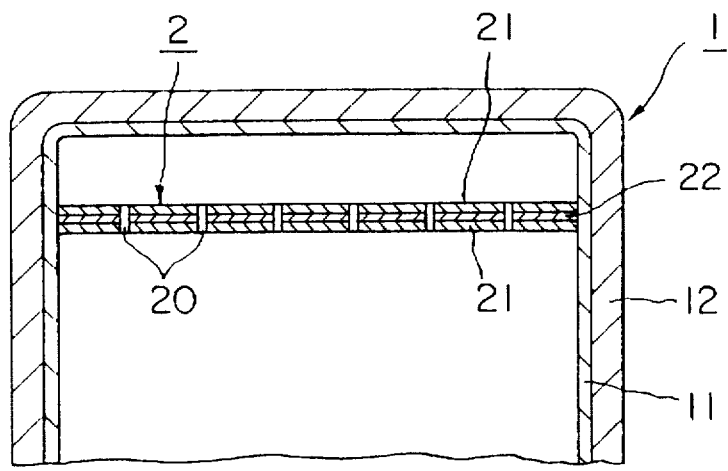
FIG. 2 is an enlarged partial vertical sectional view of a reaction tube used in the vertical heat treatment apparatus of FIG. 1.

As shown in FIG. 2, the reaction tube 1 is a double-structure glass tube of a first layer 11 of, e.g., a 1.0 mm-thickness as an inside surface which comes in contact with a heat treatment atmosphere and is made of synthetic quartz glass. Reaction tube 1 includes a second layer 12 of, e.g., a 3.0 mm-thickness which is laid on the outer side of the first layer and is made of molten quartz glass. The synthetic quartz glass is made from a silicon compound, such as silicon tetrachloride, by a synthesizing method using an oxyhydrogen flame or high-frequency induced plasma. The molten quartz glass is made from quartz as a raw material by a melting method, such as an oxyhydrogen flame melting method, electric vacuum melting method or other means. The glass introduction plate 2 is comprised of an outer layer 21 which can be on each side surface of inner layer 22 and is formed of synthetic quartz glass. The inner layer 22 is made of molten quartz glass. Inner layer 22 is positioned or laid on the inside of the outer layer 21. The second layer (of molten quartz glass) 12 of the reaction tube 1 is laid on the outside of the first layer (of synthetic quartz glass) 11 in one-piece with the first layer by flame hydrolysis, flame oxidation or other means.

As shown in FIG. 1, a heating unit 3 surrounds the reaction tube 1 on the outside of the reaction tube 1. The heating unit 3 comprises electric heat lines 32 wound on the inside of a heat insulating layer 31 of, e.g., alumina. Electric power supply to the electric heat lines 33 is controlled based on detected temperature values of thermocouple 33, e.g., temperature detecting means provided in the reaction tube 1. Gas feed pipe 41 projects into a part of the reaction tube 1 that is above the gas introduction plate 2 for the supply of a processing gas. The gas feed pipe 41 is made of quartz and extends along the outside of the reaction tube 1 at a certain interval therefrom. An exhaust pipe 42 is connected to a lower part of the reaction tube 1.

Figure 4A:
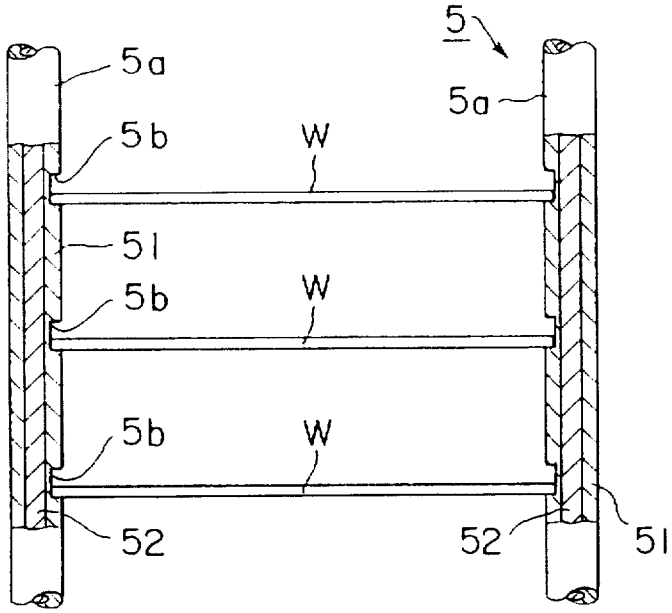
FIGS. 4A and 4B are a partial vertical sectional view and a perspective view of a structure (support rods) of the wafer boat in FIG. 1.
Figure 4B:
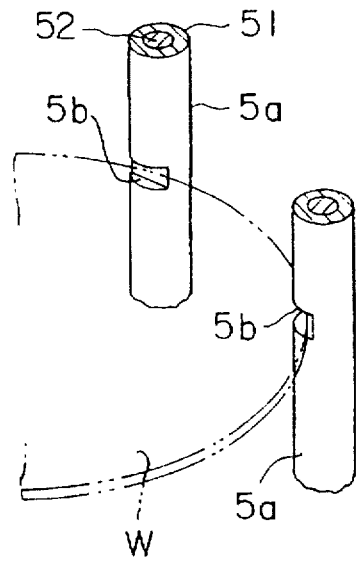
Figure 5:
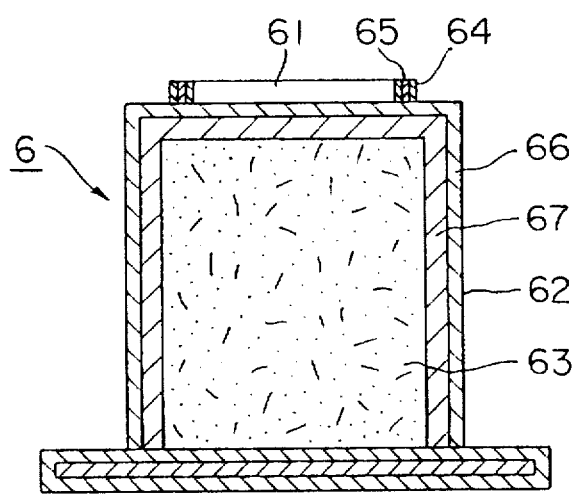
FIG. 5 is an enlarged vertical sectional view of the heat insulating cylinder in FIG. 1.
Figure 8:
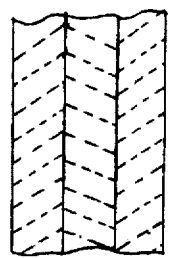
FIG. 8 shows a schematic, cross-sectional view of a three layer reaction vessel.

As shown in FIGS. 4 and 5, wafer boat 5, which is a holder for loaded wafers in the reaction tube 1, comprises four quartz support rods 5a having grooves 5b in which peripheral parts of the wafers W are received. As shown in FIG. 1, wafer boat 5 is mounted on a cap 43 for air-tightly sealing the opened lower end of the reaction tube 1 through a heat insulating cylinder 6 which is an intermediate between the two. The wafer boat 5 horizontally accommodates about 150 sheets of wafers W vertically spaced from each other. The cap 43 is provided on a boat elevator 44, and the boat elevator 44 is moved up and down to load the wafer boat 5 into and out of the reaction tube 1.

In the operation of the heat treatment apparatus according to the present invention the wafer boat 5 is first located below the reaction tube 1. Then about 150 sheets of wafers W, for example, which are objects to be processed, are mounted on wafer boat 5. The atmosphere in the reaction tube 1 is heated up to, e.g., 800° C., and the wafer boat 5 is loaded into the reaction tube 1 as in FIG. 1. Then, the interior of the reaction tube 1 is heated up to, e.g., 1200° C. A prescribed oxidation gas is fed into the reaction tube 1 from the gas feed pipe 41 through the gas introduction holes 20 while the interior of the reaction tube 1 is maintained at, e.g., 760 Torr. Silicon oxide films are formed on the treatment surfaces of the wafers W. Then, the temperature of the interior of the reaction tube 1 is lowered to a prescribed temperature, and the wafer boat 5 is moved downward out of the reaction tube through the opened lower end of the reaction tube 1.

According to the above-described embodiment, the interior of the reaction tube 1 is heated up to a high temperature of about 1200° C. The inside surface (the first layer) 11, which contact a heat treatment atmosphere, is made of synthetic quartz glass, whose contents of heavy metals, such as Al, Fe, Cu, etc., alkali metal and alkaline-earth metals are lower by two places than those of molten quartz glass. Synthetic quartz glass has high purity. Amounts of heavy metals released from the reaction tube 1 into a heat treatment atmosphere are very trivial and substantially zero. Synthetic quartz glass, whose softening point is below 1600° C., and repeated use of synthetic quartz glass in heat treatments at a temperature, e.g., 1200° C., which exceeds 1000° C. may deform the reaction tube. In the present invention, however, the reaction tube 1 has a double structure of synthetic quartz glass and molten quartz glass and has a softening point, e.g., 1700° C. Thus, as a whole, the reaction tube 1 has such heat resistance that the reaction tube 1 is free from deformation when put in use at about 1200° C. Accordingly contamination of the wafers W with impurities, such as heavy metals and alkali metals, can be reduced. In view of the fact that devices have increasingly thinner layers, and have severe limitations in allowance for impurity contamination, the above-described double structure of the reaction tube 1 is very effective for the prevention of contamination. The reaction tube 1 can include three or more layers of synthetic quartz glass and molten quartz glass laid on the second layer 12 as long as the second layer 12, which is external to the first layer is made of molten quartz glass.

Figure 3:
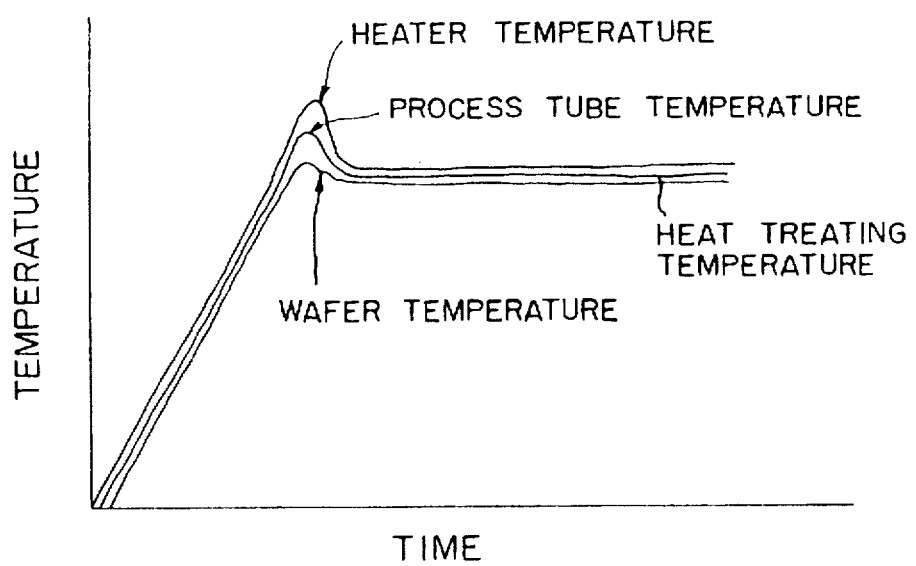
FIG. 3 is a characteristic view of temperature chambers of the heating unit, the reaction tube and wafers of the heat treatment apparatus according to the present invention.

The synthetic quartz glass of the reaction tube 1 may be devitrified quartz or vitrified quartz. The use of devitrified quartz glass provides certain advantages. That is, the electric power supply to the electric heat lines of the heating unit 3 is controlled based on detected temperature values of the thermocouple 33 in the reaction tube 2. A temperature increase in the reaction tube 2 causes a temperature increase in the sensed temperature of thermocouple 33. As shown in FIG. 3, the temperature sensed by thermocouple 33 has a tendency to overshoot (see the projected part in FIG. 3) before it stabilizes to a prescribed temperature. If the reaction tube 2 is made of vitrified quartz, almost all radiation heat from the heating unit 3 passes through the reaction tube 2 and arrives at the wafers W. A temperature of the wafers W accordingly has a tendency to overshoot. If the reaction tube 2 is made of devitrified quartz glass, radiation heat from the heating unit 2 is absorbed by the devitrified quartz. The devitrified quartz provides a so-called buffer function. As shown in FIG. 3, a temperature of the wafers W is quickly stabilized to a heat treatment temperature. That is, there is a short, unstable temperature region that immediately precedes a stabilized heat treatment temperature region.

The existence of a short, unstable temperature region immediately before a heat treatment temperature region means that the wafers W have high intra-surface temperature uniformity. Thermal budget disuniformity near a heat treatment temperature affects intra-surface uniformity of a film thickness and film quality. By making the reaction tube 1 of devitrified quartz, intra-surface uniformity in a heat treatment can be improved. If a liner tube (not shown) of, e.g., Sic is provided, surrounding the reaction tube 1 between the reaction tube 1 and the heating unit 3, the reaction tube 1 may be vitrified. The liner tube can do the function of the buffer to mitigate temperature overshoots of the wafers W. However, making the reaction tube of devitrified quartz makes it possible to produce the same effect without the use of the liner tube. According to the present invention, even if the reaction tube 1 is devitrified, the liner tube may be provided around the reaction tube 1, whereby temperatures of the wafers can be further smoothly stabilized.

The gas introduction plate 2 provided in the upper region of reaction tube 1, which also contacts a heat treatment atmosphere, also has a double glass structure of synthetic quartz glass and molten quartz glass as in the embodiment shown in FIG. 2. In this way, the scattering of heavy metals, etc. from the gas introduction plate 2 can be reduced. Furthermore, according to the present invention, glass structures (e.g., the wafer boat), which contact heat treatment atmospheres or atmospheres continuous to the heat treatment atmospheres may be laid structures of synthetic quartz glass and molten quartz glass.

FIGS. 4A and 4B are views of support rods (four) of the wafer boat 5. Each of the support rods 5a comprises an outer layer 51 of synthetic quartz glass and an inner layer 52 of molten quartz glass. 5b represents grooves formed in the support rods 5a for supporting wafers W. The support rods 5a alone are shown, but the top and the bottom plates of the wafer boat 5 comprise each an outer layer of synthetic quartz glass in contact with heat treatment atmospheres, and an inner layer of molten quartz glass. The surfaces of the grooves 5b are thus made of synthetic quartz glass.

FIG. 5 details the structure of the heat insulating cylinder in FIG. 1. A cylindrical container 62 has a receiver 61 for the wafer boat 5 on the top of the cylindrical container 62 and is stuffed with quartz wool 63. The receiver 61 comprises an outer layer 64 of synthetic quartz glass which contacts atmospheres in the reaction tube 1, and an inner layer 65 of molten quartz glass. The upper surface of the receiver 61 is made of synthetic quartz glass. The cylindrical container 62 comprises an outer layer 66 of synthetic quartz glass, and an inner layer 67 of molten quartz glass. Thus the glass structures (e.g., the heat insulating cylinder) other than the reaction tube 1 have laid structures of synthetic quartz glass and molten quartz glass, whereby contamination with heavy metals, etc. can be further reduced.

The present invention is applicable not only to vertical heat treatment apparatus, but also to single wafer heat treatment apparatus.

Such single wafer heat treatment apparatus will be explained with reference to FIGS. 6 and 7. Reference numeral 7 indicates a reaction tube. A wafer holder 81 is vertically movable into and out of the reaction tube 7. A single sheet of wafer W is mounted onto the wafer holder 81 by carrier means (not shown) below the reaction tube 7, and then the wafer is elevated on the holder 81 to a set position to be heated there up to a prescribed heat treatment temperature by a heating unit (panel heat source) 82 and heat treated (e.g., oxidation). Reference numeral 83 represents a processing gas feed pipe; 84, an exhaust pipe; and 85, a water cooling jacket.

The reaction tube 7 comprises a first layer 71 of synthetic quartz glass, which is an inside surface that contacts treatment atmospheres, and a second layer 72 of molten quartz glass which is external to the first layer 71. This laid structure of the reaction tube 7 can reduce contamination of the wafer W with metals as described above. The wafer holder 81 and the processing gas feed pipe 83 also comprise an outer layer of synthetic quartz glass which contact heat treatment atmospheres, and an inner layer of molten quartz glass. It is possible to make the wafer holder 81 of synthetic quartz glass, and the support rods 81a have a double layer structure of synthetic quartz glass and molten quartz glass.

The heat treatment apparatus according to the present invention is applicable to horizontal heat treatment apparatuses, and is applicable to heat treatments, such as diffusion, CVD, annealing, etc. The synthetic quartz glass forming a part of the reaction tube is not essentially devitrified but may be vitrified.

According to the present invention, contamination with impurities can be minimized with higher throughputs. Synthetic quartz glass forming the reaction tube is devitrified, whereby temperature overshoots taking place when objects to be heat treated are heated can be mitigated, and heat treatments can be made more stable.

What is claimed is:

1. A heat treatment apparatus which comprises:
   a heat source;
   a heat treatment atmosphere forming device; and
   a reaction vessel which is heated by said heat source and within which said atmosphere forming device forms a heat treatment atmosphere, said reaction vessel being comprised of a first and a second layer with the first layer having a heat treatment atmosphere contacting interior surface and said second layer being positioned external to said first layer,
   said first layer being comprised of a synthetic quartz glass,
   said second layer being comprised of a molten quartz glass, and
   wherein said first layer forms a monolithic body having an open bottom, closed top and side wall, and said second layer forms a monolithic body having an open bottom, closed top and side wall.

2. A heat treatment apparatus as recited in claim 1, wherein said second layer has an interior surface in direct contact with an external surface of said first layer and said second layer has a higher temperature softening point than that of said first layer such that said second layer prevents a degradation in shape of said first layer.

3. A heat treatment apparatus as recited in claim 2, wherein said reaction vessel further comprises a third glass layer positioned external to said first layer.

4. A heat treatment apparatus as recited in claim 3, wherein said third glass layer is a molten glass layer formed of natural quartz and is laid over said second layer.

5. A heat treatment apparatus as recited in claim 3, wherein said third glass layer is a synthesized quartz glass formed of a silicon compound.

6. A heat treatment apparatus as recited in claim 5, wherein said silicon compound is silicon tetrachloride.

7. A heat treatment apparatus as recited in claim 1, wherein said first layer is devitrified.

8. A heat treatment apparatus as recited in claim 1, wherein said synthetic quartz glass is made from silicon tetrachloride.

9. A heat treatment apparatus as recited in claim 1, wherein said second layer is thicker than said first layer.

10. A heat treatment apparatus as recited in claim 1, further comprising a gas introduction plate having gas introduction holes formed therein, said gas introduction plate being supported by said first layer adjacent the closed top of said vessel, and said heat treatment atmosphere forming device including a gas conduit with an outlet positioned between said closed top and said gas introduction plate.

11. A heat treatment apparatus as recited in claim 10, wherein said introduction plate includes an intermediate layer formed of a molten quartz glass and two outer layers of synthetic quartz glass.

12. A heat treatment apparatus as recited in claim 1, wherein said second layer is three times as thick as said first layer.

13. A heat treatment apparatus as recited in claim 1, further comprising a liner tube which extends around said reaction vessel.

14. A heat treatment apparatus which comprises:

a heat source;

a heat treatment atmosphere forming device; and a reaction vessel which is heated by said heat source and within which said atmosphere forming device forms a heat treatment atmosphere, said reaction vessel being comprised of a first and a second layer with the first layer having a heat treatment atmosphere contacting interior surface and said second layer being positioned external to said first layer, said first layer being comprised of a synthetic quartz glass, said second layer being comprised of a molten quartz glass, and wherein said first layer is devitrified.

15. A heat treatment apparatus which comprises:

a heat source;

a heat treatment atmosphere forming device;

a reaction vessel which is heated by said heat source and within which the heat treatment atmosphere forming device forms a heat treatment atmosphere, and said heat treatment apparatus including a glass structure which has a first layer comprised of a synthetic quartz glass that has a surface which comes in contact with an atmosphere supplied by said heat treatment atmosphere forming device and a second layer comprised of a molten quartz glass, and wherein said glass structure is an objects-to-be treated holder for holding objects to be heat treated by said heat treatment apparatus.

16. A heat treatment apparatus as recited in claim 15, wherein said first layer is laid on the second layer.

17. A heat treatment apparatus as recited in claim 15, wherein the objects-to-be treated holder is a wafer boat having a first plate, a second plate and support rods extending between said plates, and said first and second plates and said support rods being comprised of said first and second layers with said first layer representing an outer layer of said glass structure and said second layer an inner layer of said glass structure.

18. A heat treatment apparatus as recited in claim 15, wherein said a heat treatment apparatus includes a layer of devitrified quartz glass.

19. A heat treatment apparatus which comprises:

a heat source;

a heat treatment atmosphere forming device;

a reaction vessel which is heated by said heat source and within which the heat treatment atmosphere forming device forms a heat treatment atmosphere, and said heat treatment apparatus including a glass structure which has a first layer comprised of a synthetic quartz glass that has a surface which comes in contact with an atmosphere supplied by said heat treatment atmosphere forming device and a second layer comprising of a molten quartz glass, wherein said first layer is laid on the second layer, said apparatus further comprising a bottom cap dimensioned to seal an opening in said reaction vessel, an intermediate member positioned between said holder and said cap, and means for moving said cap into and out of sealing position and said holder into and out of said reaction vessel, and at least a part of said intermediate member has said glass structure.

20. A heat treatment apparatus as recited in claim 19, wherein said intermediate member is a heat insulating cylinder and said first layer forms an outer layer of said heat insulating cylinder and said second layer forms a more inner layer of said heat insulating cylinder.

21. A heat treatment apparatus as recited in claim 20, wherein each of said reaction vessel, said objects-to-be treated holder and said heat insulating cylinder are formed of a first layer of synthetic quartz glass and a second layer of molten natural quartz glass.

22. A heat treatment apparatus which comprises;

a heat source;

a heat treatment atmosphere forming device; and a reaction vessel which is heated by said heat source and within which the heat treatment atmosphere forming device forms a heat treatment atmosphere, and said heat treatment apparatus including a glass structure which has a first layer comprised of a synthetic quartz glass that has a surface which comes in contact with an atmosphere supplied by said heat treatment atmosphere forming device and a second layer comprised of a molten quartz glass, wherein said first layer is laid on the second layer, and wherein said glass structure is a gas introduction plate having a number of gas holes formed therein, said gas introduction plate being positioned immediately below a top end of said reaction vessel.

23. A heat treatment apparatus as recited in claim 22, wherein said glass structure further comprises a third layer of quartz and said third layer is formed of a synthetic quartz glass material and said second layer is sandwiched between said first and third layers of synthetic quartz glass.

24. A heat treatment apparatus comprising:

a heat source;

a heat treatment medium supply system;

a reaction vessel which is heated by said heat source and which includes a heat treatment cavity into which said medium supply system supplies a heat treatment medium, said reaction vessel being formed of a first synthetic quartz glass layer which has an interior surface at least partially defining said heat treatment cavity, a second molten quartz glass layer positioned externally to said first layer, and a third quartz glass layer also positioned externally to said first layer.

* * * * *